Figure 1:
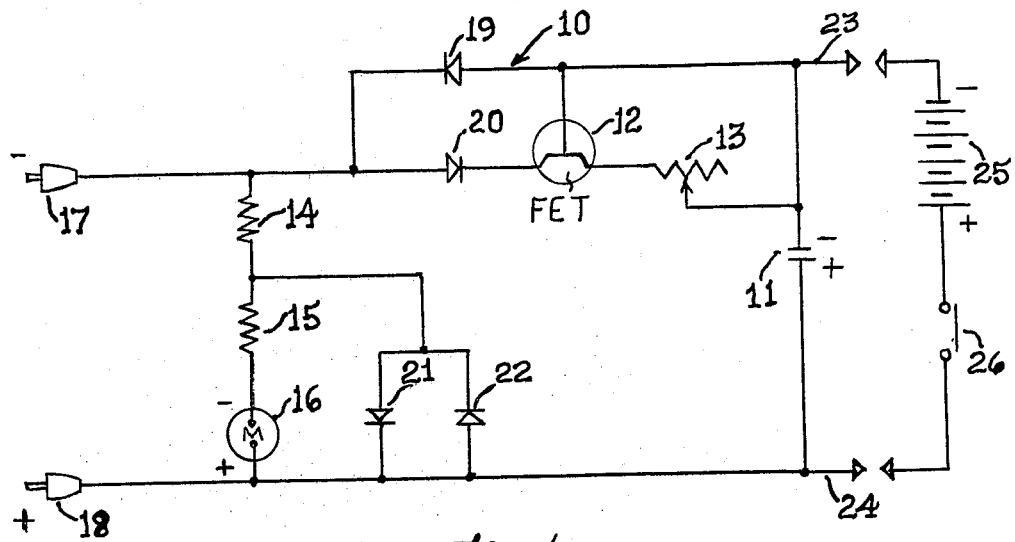

United States Patent [19]

Goldish et al.

[11] 4,088,949
[45] May 9, 1978

[54] BATTERYLESS OHMMETER

[76] Inventors: Milton Goldish; Arthur Edward Evenson, both of 4500 W. Cortland, Chicago, Ill. 60639

[21] Appl. No.: 774,321
[22] Filed: Mar. 4, 1977
[51] Int. Cl.² .................................................. G01R 27/02
[52] U.S. Cl. ............................................. 324/62; 320/1
[58] Field of Search .................. 324/62, 123 R; 320/1; 340/237 S; 250/376, 377, 378

[56] References Cited

U.S. PATENT DOCUMENTS

| 2,455,543 | 12/1948 | Williams | 324/62 X |
|---|---|---|---|
| 2,841,716 | 7/1958 | Rich | 250/378 |
| 2,980,799 | 4/1961 | Bongrain et al. | 250/376 |
| 2,995,704 | 8/1961 | Norgaard | 324/62 |
| 3,222,523 | 12/1965 | Kowalski | 250/376 X |
| 3,284,707 | 11/1966 | Clinton | 324/62 |
| 3,328,685 | 6/1967 | Hewlett | 324/62 |
| 3,491,293 | 1/1970 | Seaborn, Jr. | 324/62 |
| 3,636,440 | 1/1972 | Stanford | 324/62 X |
| 3,811,123 | 5/1974 | Hamm et al. | 340/237 S X |

Primary Examiner—Stanley T. Krawczewicz
Attorney, Agent, or Firm—Edward C. Threedy

[57] ABSTRACT

An ohmmeter and circuit therefor which does not require an internal battery or a continuing coupling to an external voltage source during normal use, with the necessary operating electrical power supplied through a high capacity capacitor which, after initial energization by a temporary connection to an external voltage source, develops a stored source of operating power. As the operating current is constant, there is no necessity for scale adjustment prior to each use of the ohmmeter.

6 Claims, 2 Drawing Figures

4,088,949

BATTERYLESS OHMMETER

SUMMARY OF THE INVENTION

The purpose of this invention is to provide an ohmmeter having a novel circuit which eliminates three problems that in the past have been inherent in ohmmeter circuits: The first is to preclude in certain usage situations the need for an internal battery as a source of operating voltage; the second is to provide a simplified and instant means for initial ohmmeter calibration prior to use; and the third is to prevent the ohmmeter's internal battery, when one is incorporated in the convertible circuit, from running down prematurely due to the circuit's being left on accidentally.

In certain ohmmeter applications, particularly those concerning the electrical systems of automotive type vehicles, it is highly desirable not to have to contend with an internal battery. The absence of an internal battery eliminates the need for periodic battery replacement and also the need for continual circuit recalibrations on the scale of the ohmmeter.

The present invention relates to a batteryless ohmmeter, in that it does not depend, during its use period, on any outside source of power, yet it functions as a traditional ohmmeter in all respects.

The devices of the prior art include ohmmeters which provide for an internal battery or those which may be classified as pseudobatteryless ohmmeters. This latter class of ohmmeters, although they do not contain an internal battery, do rely upon an external battery, such as a vehicle battery, and must remain connected to it during the time the ohmmeter circuit is being used.

Another major inconvenience with respect to traditional ohmmeters was the necessity to calibrate the instrument prior to each use or when switching from range to range. The present invention eliminates this inconvenience by providing what is termed an "automatic ohm set." This automatic ohm set is achieved through the use of a constant current generator within the ohmmeter. Through the use of a constant current generator, the ohmmeter current is held constant, even though the voltage of the power source is gradually decreasing.

There is also a provision in the circuitry for the inclusion of an internal battery when the ohmmeter of this invention is to be used for non-automotive type of applications—that is, where a suitable external battery or other power source is not readily available.

GENERAL DESCRIPTION

Figure 2:
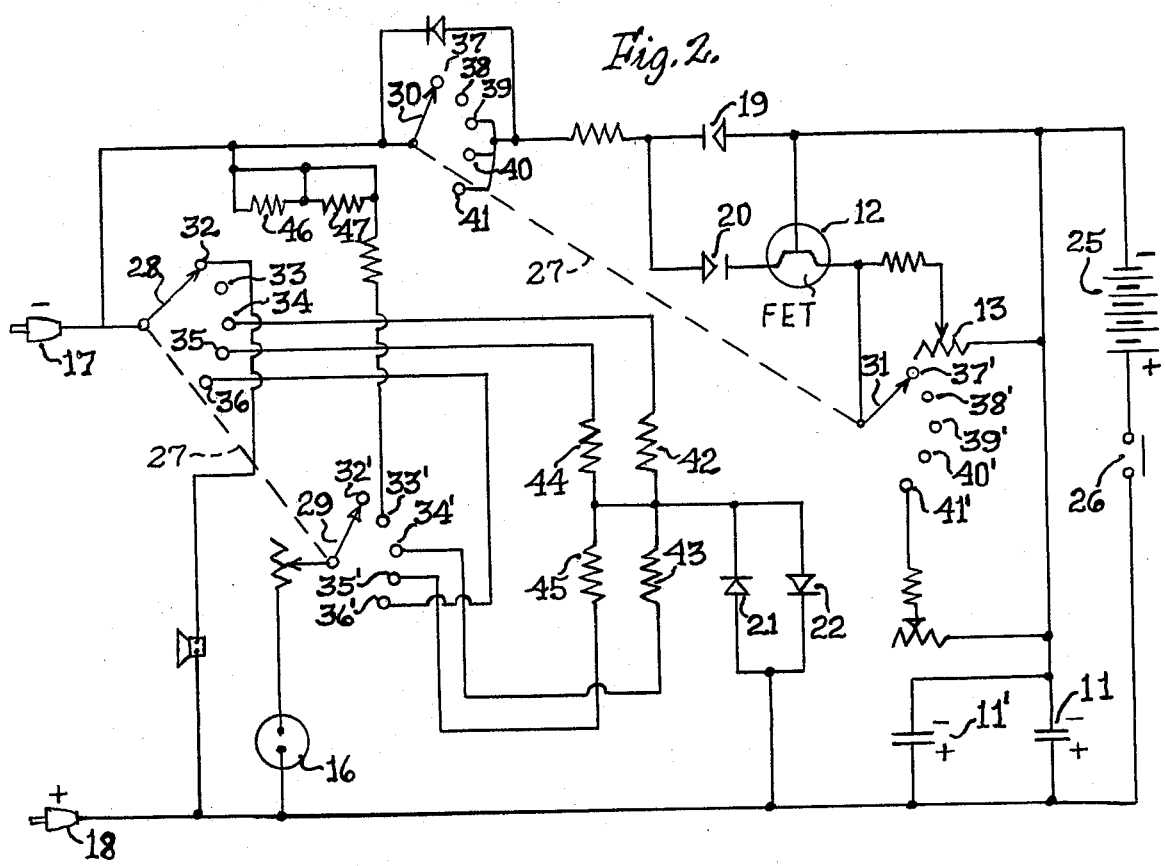

The invention will be best understood by reference to the accompanying drawings which illustrate the preferred embodiment of the circuitry of this invention by which the objects are achieved, and in which:

FIG. 1 is a schematic view of the constant-current batteryless ohmmeter circuit; and FIG. 2 is a schematic circuit for a complete measuring device whereby a number of different tests can be registered on the visual meter.

The basic circuit 10, as shown in FIG. 1, consists of three main components: an energy storage capacitor, a constant current generator, and a resistance-indicating network.

The function of the energy storage capacitor 11 is to provide a temporary power source for the remainder of the ohmmeter circuit 10. The purpose of the field effect transistor 12 as well as the rheostat 13 is to provide a constant current generator for the resistance-indicating network consisting of series resistors 14 and 15 and a meter 16 provided with a plurality of calibrated scales such as is commercially available.

When the initial voltage on the capacitor 11 decreases as the capacitor discharges, the constant current generator consisting of the transistor 12 and the rheostat 13, maintains a fixed current flow through the meter 16.

The circuit 10 operates in the following manner: Assuming that the capacitor 11 is initially discharged, when the test leads 17 and 18 are connected in proper polarity across an external voltage source (not shown), a charging current flows into capacitor 11 through diode 19. After approximately one second, the capacitor 11 will be essentially charged. Diode 20 prevents the charging current from flowing through the transistor 12.

Should the test leads 17 and 18 be connected improperly to the external voltage source, the diode 19 prevents any reverse charge on capacitor 11. Although the diode 20 will be in its forward direction, the normal polarity of transistor 12 prevents any current flow. It is therefore impossible to reverse-charge the capacitor 11 due to improper test lead connections.

Once the capacitor 11 has been charged and the test leads 17 and 18 disconnected from the external voltage source, the capacitor 11 begins to discharge at a constant rate through the constant current generator. This continues until the voltage on the capacitor 11 drops below a threshold limit of the constant current generator, at which time the current is no longer held constant.

The typical threshold limit is approximately 2½ to 3 volts; the normal full charge voltage on the capacitor ranges from 9 to 15 volts, depending on the original source voltage. The operating period of the ohmmeter, that is, the period during which the capacitor discharge current is held constant, is the time it takes the capacitor 11 to discharge from its initial charge voltage to the threshold charge limit. This period is the function of the initial charge voltage on the capacitor 11, its capacitance and the discharge current. With an initial voltage of 12 volts, a capacity of 18,000 mfd., and a constant discharge current of 200 ua., the normal operating period is approximately 15 minutes.

The resistance-indicating network consists of resistors 14 and 15 and meter 16. The diodes 21 and 22 function as current overload protectors for the meter 16 when the test leads 17 and 18 are momentarily connected to an external voltage source during the recharging of the capacitor 11. They serve no other function and, electrically, are out of the circuit during normal ohmmeter use.

When the test leads 17 and 18 are not connected to any external resistance (in other words, in an open circuit condition), the meter 16 reads full scale. The scale of the meter 16 actually includes a narrow band, either colored or marked initially by suitable terms, to indicate to the user that the ohmmeter is usable and accurately calibrated. Should the indicator on the meter 16 read below this specifically marked "full scale band," the recharging of the capacitor 11 is indicated. Thus, the user is provided with a continuous monitoring of the ohmmeter's calibration.

Although the constant current generator as above identified is defined as including a field effect transistor 12 and a rheostat 13 functioning as a bias control, any of a variety of components and configurations could be used to achieve the desired constant current effect.

However, in the illustrated circuit 10, it is the rheostat 13 or bias control that sets the level of the current being regulated.

A mid-scale ohmmeter reading is determined by the total resistance of resistors 14 and 15 and the meter 16. It will be obvious to those familiar with ohmmeter circuits that additional ranges can be obtained simply by switching in different values for the resistors 14 and 15. This change is accomplished by the schematic circuitry shown in FIG. 2. Changing ranges in this manner does not affect the initial calibration of the meter 16, since this is controlled by the above-mentioned components comprising the constant current generator.

Referring to FIG. 1, the circuit 10 is provided with external lead connections 23 and 24 which can accept an additional circuitry which includes, as optional to the ohmmeter, a typical 9 v. DC battery 25, together with a normally open momentary pushbutton switch 26. By the addition of the optional circuit, provision is made in the circuit 10 for an internal battery power source when the ohmmeter is to be used for non-automotive type applications, that is, where a suitable external battery or other power source is not readily available. By momentarily pressing the normally open pushbutton switch 26, the internal battery 25 will be temporarily connected in circuit to the ohmmeter circuit 10 and thereby recharge the storage capacitor 11. As far as the ohmmeter circuit is concerned, the results are the same as were produced by attaching the test leads 17 and 18 to an external battery.

Since the internal battery 25, when used, is connected to the circuit 10 only when the normally open pushbutton switch 26 is closed, it cannot accidentally remain connected and run down. As a result, the life of the battery 25 in normal service is considerably prolonged.

When the instrument is being used in its batteryless mode, there is, of course, no internal battery to become run down or to be replaced.

Referring to FIG. 2, the circuit 10 is incorporated in a complete instrument by which not only are range changes achieved, but also the instrument may be used as a circuit tracer and a voltmeter.

The range of the scale of the meter 16 can be changed simply by switching in different values for the resistors 14 and 15. In the circuitry of FIG. 2, it is noted that there is included a rotary switch 27 having a dual set of wipers 28 and 29, as well as a like set of wipers 30 and 31. On the face of the rotary switch 27, the wipers 28 and 29 will move over five individual contacts 32—32', 33—33', 34—34', 35—35', and 36—36', all of which are wired to the front face of the rotary switch 27, while the wiper arms 30 and 31 will move in unison over contacts 37—37', 38—38', 39—39', 40—40', and 41—41', all of which are wired to the back face of the rotary switch 27.

To change the range of the ohmmeter 16 from that incorporated in the circuit 10 of FIG. 1, the rotary switch 27 may be actuated so that the wipers 28-29 and 30-31 are moved onto their respective contacts 34—34' and 39—39', at which time the resistors 42 and 43 will be brought into series connection with the meter 16 to change the scale to ohms × b 10. To change the range of the circuitry of FIG. 2 to ohms × 1, the rotary switch 27 is actuated so that the respective wipers thereof move onto the fourth position contacts 35—35' and 40—40', at which time the resistors 44 and 45 of different values will be brought into contact with the meter 16.

If the circuitry of FIG. 2 is used as a volt-meter, the rotary switch 27 is actuated to place the respective wiper arms 28-29 and 30-31 on their second contacts 33—33' and 38—38', at which time the series connected resistors 46 and 47 are connected in circuit to the meter 16.

From the foregoing, range changing, particularly for very low ohmmeter ranges, can be achieved by varying the regulated current of the constant current generator. In this respect, the proposed invention has an additional advantage over traditional ohmmeters in which such a range-changing technique cannot be used.

It should be noted that the particular circuit arrangement employed in the instrument of this invention, known generically as a "shunt-type ohmmeter," provides a forward reading, i.e., from left to right, on the ohms scale. This, together with the automatic ohms set feature, makes the instrument especially easy to use.

The usual calibration procedure of prior devices entails clipping the leads 17 and 18 together and adjusting a rheostat and potentiometer until the meter reads at a certain point on the scale. This procedure must normally be repeated each time the ohmmeter range is changed and periodically as the instrument is used. Through the present invention, that procedure and its attendant inconvenience is eliminated by the automatic ohms set. This feature is afforded by the use of the constant current generator within the ohmmeter circuit. The holding constant of current from the power source, that is, the current supplied by the discharging capacitor 11, through the present rheostat 13 and transistor 12, permits the meter to read at its preset calibrations, with little or no adjustment necessary.

From the foregoing, it is apparent that there is provided in the batteryless ohmmeter of this invention an energy storage device for temporarily retaining sufficient energy to operate the instrument over a reasonable period of time. There is included a means for readily charging the energy storage device from either an internal or external source. There is provided a means for controlling or regulating at a nearly constant level the output or discharge current of the storage device, which functions with a resistance-measuring network, with a suitable indicator or meter for receiving the above regulated discharge current of the storage device.

While we have illustrated and described the preferred form of construction for carrying our invention into effect, this is capable of variation and modification without departing from the spirit of the invention. We, therefore, do not wish to be limited to the precise details of construction set forth, but desire to avail ourselves of such variations and modifications as come within the scope of the appended claims.

Having thus described our invention, what we claim as new and desire to protect by Letters Patent is:

1. A batteryless ohmmeter including a meter provided with a plurality of calibrated scales comprising
   a. a battery test circuit including a chargeable energy storage device,
   b. a constant current generator in circuit with said energy storage device and through which current is discharged into the meter,
   c. a pair of test leads provided by said battery test circuit and adapted to be momentarily connected to an external voltage source for charging said energy storage device, and d. a resistance-measuring network including the meter in circuit with said constant current generator for determining the scale calibration of the meter when said battery test circuit is in use.

2. A circuit for a batteryless ohmmeter as defined by claim 1, including means in said battery test circuit for preventing current overload on said meter as said energy storage device is charged when said test leads are connected to an external voltage source.

3. A circuit for a batteryless ohmmeter as defined by claim 1, including means in said battery test circuit for preventing reverse charging of said energy storage device when said test leads are improperly connected to an external voltage source.

4. A circuit for a batteryless ohmmeter as defined by claim 3, including means in said battery test circuit for preventing current overload on said meter as said energy storage device is charged when said test leads are connected to an external voltage source.

5. A circuit for a batteryless ohmmeter as defined by claim 1, including an auxiliary circuit including a battery and means for temporarily connecting said battery in said ohmmeter circuit for recharging said energy storage device.

6. A circuit for a batteryless ohmmeter as defined by claim 5, wherein said means for temporarily connecting said battery in said ohmmeter circuit comprises a manually operated push button switch.

* * * * *